United States Patent
Lee et al.

(10) Patent No.: US 9,832,005 B2
(45) Date of Patent: *Nov. 28, 2017

(54) HIGH-SPEED INTERFACE APPARATUS AND DESKEW METHOD THEREOF

(71) Applicant: SAMSUNG ELECTRONICS CO., LTD., Suwon-si, Gyeonggi-do (KR)

(72) Inventors: Han Soo Lee, Hwaseong-si (KR); Sung Jun Kim, Seongnam-si (KR); Chae Ryung Kim, Seoul (KR); Dong Uk Park, Hwaseong-si (KR); Youn Woong Chung, Seongnam-si (KR); Jung Myung Choi, Yongin-si (KR); Han Kyul Lim, Seoul (KR); Gyeong Han Cha, Geoje-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/007,367

(22) Filed: Jan. 27, 2016

(65) Prior Publication Data

US 2016/0142199 A1 May 19, 2016

Related U.S. Application Data

(63) Continuation of application No. 14/513,949, filed on Oct. 14, 2014, now Pat. No. 9,281,935.

(30) Foreign Application Priority Data

Feb. 13, 2014 (KR) .................. 10-2014-0016905

(51) Int. Cl.
*H04L 7/00* (2006.01)
*H04L 25/14* (2006.01)

(52) U.S. Cl.
CPC ............ *H04L 7/0016* (2013.01); *H04L 25/14* (2013.01)

(58) Field of Classification Search
CPC ......... H04L 7/00; H04L 7/0016; H04L 7/033; H04L 7/0337; H04L 25/14; H04L 25/40
See application file for complete search history.

(56) References Cited

U.S. PATENT DOCUMENTS

| | | |
|---|---|---|
| 6,914,637 B1 | 7/2005 | Wolf et al. |
| 7,031,420 B1 | 4/2006 | Jenkins et al. |
| 9,036,751 B1 | 5/2015 | Wang et al. |
| 2008/0106306 A1 | 5/2008 | Keady et al. |
| 2009/0190690 A1* | 7/2009 | Kuwata ............... H04L 25/14 375/291 |
| 2009/0290671 A1 | 11/2009 | Rea et al. |
| 2011/0110412 A1 | 5/2011 | Shin |

(Continued)

*Primary Examiner* — Khanh C Tran
(74) *Attorney, Agent, or Firm* — F. Chau & Associates, LLC

(57) ABSTRACT

A high-speed interface apparatus and method of correcting skew in the apparatus are provided. A high-speed transmitter includes a transmission D-PHY module that generates and transmits a clock signal through a clock channel, generates a deskew synchronous code and test data in response to a deskew request signal, transmits the deskew synchronous code followed by the test data through a data channel, and transmits a normal synchronous code followed by normal data through the data channel in normal mode.

17 Claims, 20 Drawing Sheets

(56) References Cited

U.S. PATENT DOCUMENTS

| | | | |
|---|---|---|---|
| 2012/0120289 A1* | 5/2012 | Sugioka | G06T 1/0007 348/294 |
| 2013/0076425 A1 | 3/2013 | Oh et al. | |
| 2014/0300755 A1* | 10/2014 | Funamoto | H04L 1/0045 348/187 |
| 2015/0192949 A1 | 7/2015 | Wu et al. | |
| 2015/0229467 A1 | 8/2015 | Lee et al. | |

* cited by examiner

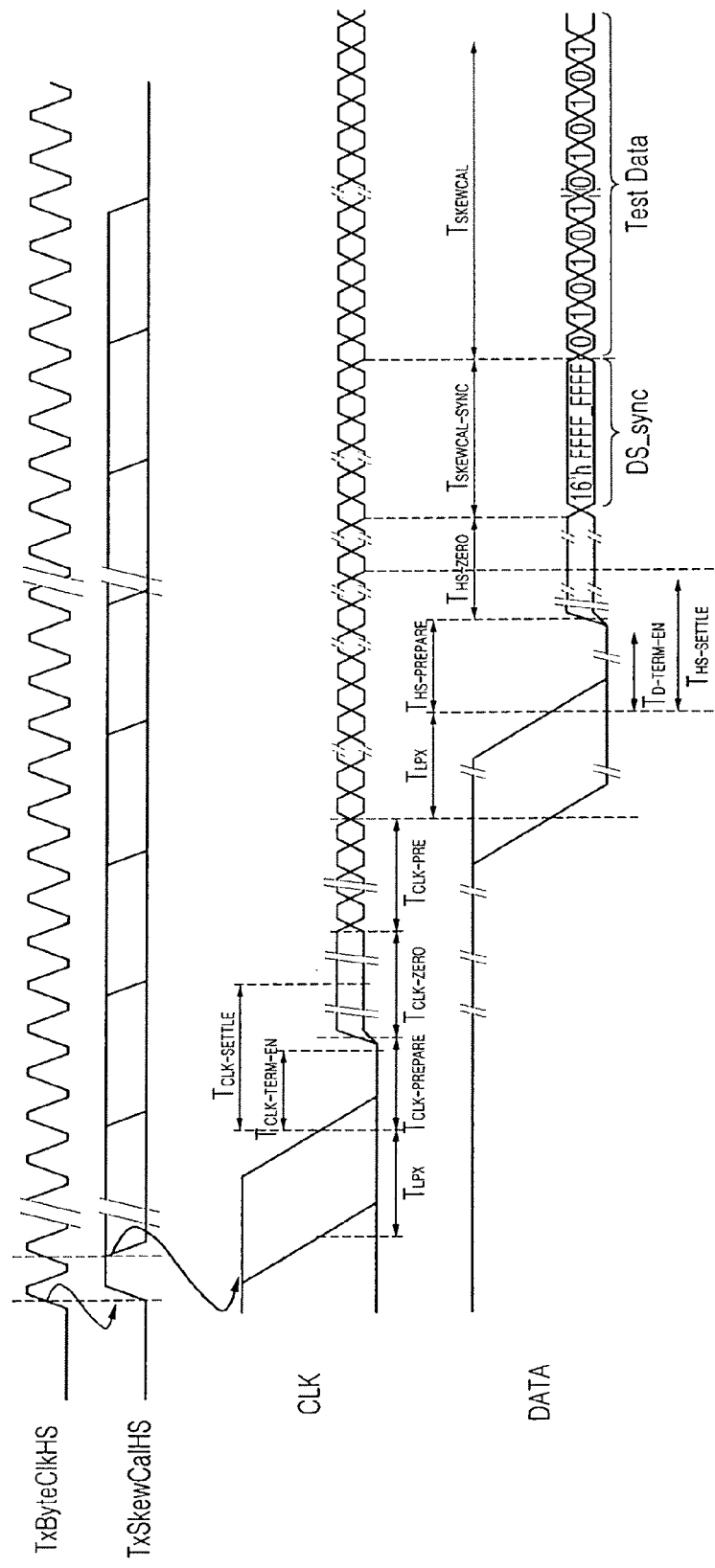

HIGH-SPEED INTERFACE APPARATUS AND DESKEW METHOD THEREOF

CROSS-REFERENCE TO RELATED APPLICATIONS

This application is a continuation application of co-pending U.S. application Ser. No. 14/513,949 filed Oct. 14, 2014, which claims priority under 35 U.S.C. §119(a) to Korean Patent Application No. 10-2014-0016905 filed on Feb. 13, 2014, the disclosures of which are incorporated by reference herein in their entireties.

INCORPORATION-BY-REFERENCE OF MATERIAL

The disclosure of MIPI Alliance specification for D-PHY version 1.2 adopted on Dec. 31, 2013 by the MIPI Alliance is incorporated by reference.

BACKGROUND

Technical Field

Embodiments of the inventive concept relate to a data interface apparatus and method, and more particularly, to a high-speed interface apparatus for transmitting serial data at high speed and a deskew method thereof.

Discussion of Related Art

A method of transmitting serial data at high speed is usually used for interface in display devices or image sensors. Such high-speed interface methods include a low voltage differential signaling (LVDS) interface and a mobile industry processor interface (MIPI).

High-speed interface systems provide giga-level high-speed data transmission and transmit a clock signal and data through separate channels. Accordingly, a transmitter outputs the clock signal and the data at the same time. However, a phase difference (i.e., a skew) may occur between the clock signal and the data in a receiver.

Since the receiver recovers the data using the clock signal, it can be difficult to interpret the data when there is skew between the clock signal and the data. Therefore, it is important to compensate for the skew between the clock signal and the data.

SUMMARY

According to an exemplary embodiment of the inventive concept, there is provided a high-speed data transmitter including a transmission link module and a transmission D-PHY module. The transmission D-PHY module includes a transmission clock generator configured to generate and transmit a clock signal through a clock channel and at least one transmission channel unit configured to generate a deskew synchronous code and test data and transmit the test data following the deskew synchronous code through a data channel in a deskew mode and to transmit normal data following a normal synchronous code through the data channel in a normal mode.

The deskew synchronous code has a different pattern than the normal synchronous code. The at least one transmission channel unit may include a deskew synchronous code generator configured to generate the deskew synchronous code in response to a deskew request signal and to output the deskew synchronous code to the data channel, a test data generator configured to generate the test data in response to the deskew request signal and output the test data following the deskew synchronous code to the data channel, a normal synchronous code generator configured to generate and output the normal synchronous code to the data channel in the normal mode, and a normal data processor configured to receive the normal data in parallel and convert the normal data to serial normal data in the normal mode.

The transmission link module may include a deskew controller configured to generate the deskew request signal in a vertical blank period between frames.

According to an exemplary embodiment of the inventive concept, there is provided a high-speed data receiver including a clock receiver configured to receive a clock signal through a clock channel, a code detector configured to receive a synchronous code through a data channel and to detect whether the synchronous code is a deskew synchronous code or a normal synchronous code, a normal data processor configured to receive serial normal data through the data channel and convert the serial normal data to parallel normal data when the synchronous code is detected as the normal synchronous code, and a test data processor configured to receive test data through the data channel and detect an amount of skew between the clock signal and the test data using the test data when the synchronous code is detected as the deskew synchronous code.

The normal synchronous code may be "00011101" and the deskew synchronous code may be "FFFFFFFF".

The test data may have a pattern in which 0 and 1 alternate.

The test data processor may sequentially delay the test data by a unit delay time, compare delayed test data with a predetermined deskew data pattern, determine pass or fail, and detect the amount of skew.

According to an exemplary embodiment of the inventive concept, there is provided a method of correcting skew between a clock signal and data in a high-speed interface system including a transmitter and a receiver, which are connected through a clock channel and at least one data channel. The method includes the transmitter transmitting the clock signal through the clock channel in a normal mode and a deskew mode; the transmitter transmitting a normal synchronous code through the at least one data channel and transmitting normal data following the normal synchronous code in the normal mode; the transmitter transmitting a deskew synchronous code different from the normal synchronous code through the at least one data channel and transmitting test data following the deskew synchronous code in the deskew mode; the receiver receiving a code from the transmitter and determining whether the code is the deskew synchronous code; and the receiver detecting an amount of skew between the clock signal and the test data using the test data when the code is the deskew synchronous code.

The detecting the amount of skew may include sequentially delaying the test data by a unit delay time, comparing the delayed data with a predetermined deskew data pattern to determine pass or fail, and determining a deskew delay according to a result of the determination.

The method may further include receiving the normal data and delaying the normal data by a time corresponding to the deskew delay when the code is the normal synchronous code.

According to an exemplary embodiment of the inventive concept, there is provided a high-speed data interface including a clock channel, at least one data channel, a transmitter configured to transmit data across the at least one data channel and transmit a clock signal across the clock channel, and a receiver configured to receive the transmitted data and clock signal, and delay the received data according to a delay time to synchronize the received data with the clock signal. The transmitter is configured to sequentially transmit test data and a first code during a first mode and the receiver is configured to compare the test data against a predetermined data pattern in response to receipt of the first code to determine the delay.

In an exemplary embodiment of the inventive concept, the transmitter is further configured to sequentially transmit normal data and a second other code during a second mode, and the receiver is configured to delay the normal data using the determined delay in response to receipt of the second code.

The transmitter may be configured to transmit data in a MIPI standard and the receiver may be configured to receive data in a MIPI standard.

The first mode may occur during a power-up of the high-speed data interface.

In an exemplary embodiment, the data is image data including several frames, a vertical blanking period is present between each of the frames, and the first mode occurs during at least one of the vertical blanking periods.

BRIEF DESCRIPTION OF THE DRAWINGS

The inventive concept will become more apparent by describing in detail exemplary embodiments thereof with reference to the attached drawings in which:

FIGS. 11A and 11B are signal timing charts for explaining a method of starting a deskew mode in a transmitter according to an exemplary embodiment of the inventive concept;

DETAILED DESCRIPTION

Figure 1:
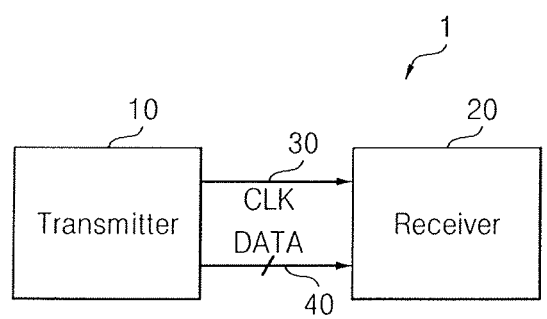
FIG. 1 is a schematic block diagram of a high-speed interface system according to an exemplary embodiment of the inventive concept.

The inventive concept now will be described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise.

Embodiments of the inventive concept provide a new protocol for compensating for skew between a clock signal and data in a high-speed interface system.

FIG. 1 is a schematic block diagram of a high-speed interface system 1 according to an exemplary embodiment of the inventive concept. The high-speed interface system 1 includes a transmitter 10, a receiver 20, a clock channel 30, and at least one data channel 40. It is assumed that the high-speed interface system 1 is a mobile industry processor interface (MIPI) system using MIPI®. However, the embodiments of the inventive concept are not restricted to the MIPI system.

MIPI is a serial interface standard defined by the MIPI Alliance for connection between a processor and peripheral devices. MIPI D-PHY is a high-speed digital serial interface. MIPI D-PHY display serial interface (DSI) and camera serial interface (CSI) are protocol standard specifications for D-PHY-based displays and cameras.

In an exemplary embodiment, the transmitter 10 is configured to transmit data to the receiver 20 according to a MIPI standard (e.g., MIPI Alliance specification for D-PHY) and may be referred to as a master device. In an exemplary embodiment, the receiver 20 is configured to receive data from the transmitter 10 according to the MIPI standard and may be referred to as a slave device.

A clock signal CLK may be a unidirectional signal transmitted from the transmitter 10 to the receiver 20 through the clock channel 30. Data DATA may be a unidirectional or bidirectional signal. But, it is assumed that the data DATA is a unidirectional serial signal transmitted from the transmitter 10 to the receiver 20 in at least one embodiment of the inventive concept.

Figure 2:
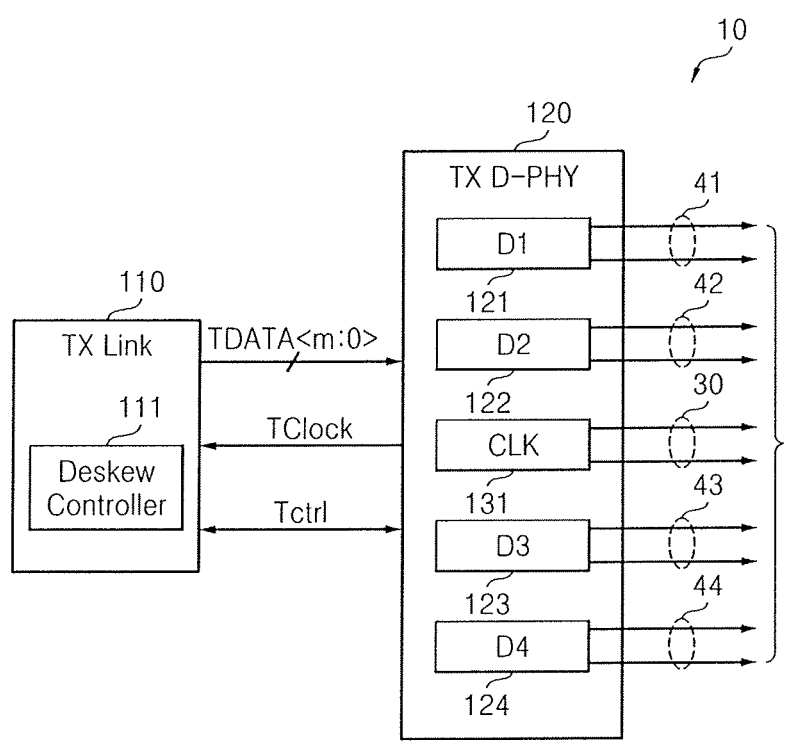
FIG. 2 is a block diagram of a transmitter illustrated in FIG. 1 according to an exemplary embodiment of the inventive concept.
Figure 3:
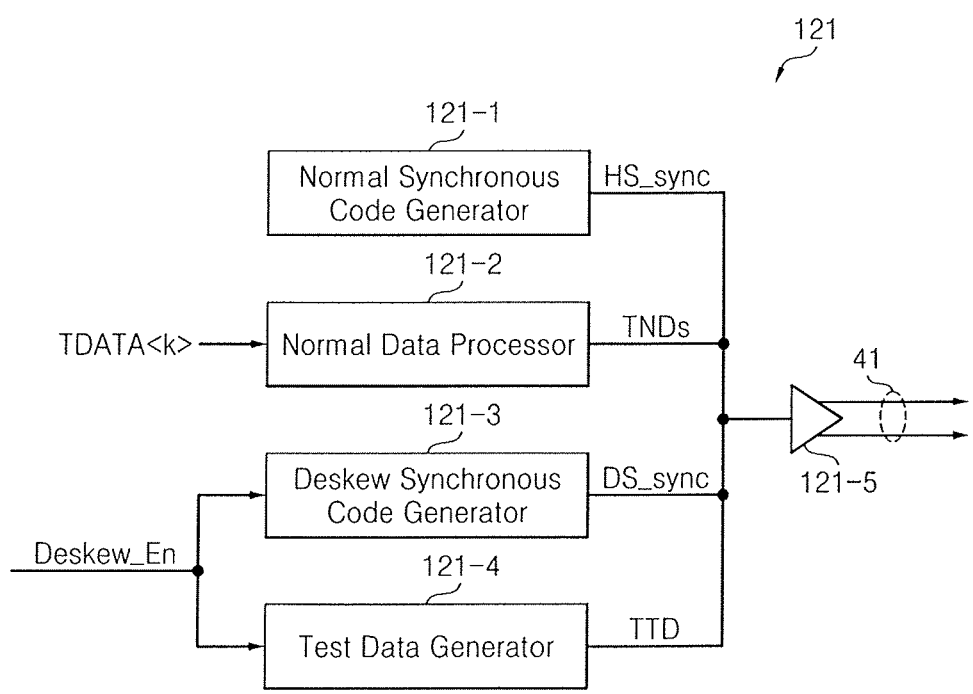
FIG. 3 is a block diagram of a first transmission channel unit illustrated in FIG. 2 according to an exemplary embodiment of the inventive concept.

FIG. 2 is a block diagram of the transmitter 10 illustrated in FIG. 1 according to an exemplary embodiment of the inventive concept. FIG. 3 is a block diagram of a first transmission channel unit 121 illustrated in FIG. 2 according to an exemplary embodiment of the inventive concept. While four data channels, i.e., first through fourth data channels 41, 42, 43, and 44 and one clock channel 30 are provided in the embodiment illustrated in FIG. 2, the numbers of data channels and clock channels are not restricted thereto. A data channel and a clock channel may respectively correspond to a data lane and a clock lane in the MIPI standard. Referring to FIGS. 2 and 3, the transmitter 10 includes a transmission link module TX Link or 110 and a transmission D-PHY module TX D-PHY or 120. In an exemplary embodiment, 110 or 120 is implemented by a central processing unit, a field programmable gate array, etc.

The transmission link module 110 controls an operation of the transmission D-PHY module 120 using a transmission control signal Tctrl. The transmission link module 110 receives a transmission clock signal TClock from the transmission D-PHY module 120 and synchronizes the transmission control signal Tctrl with the transmission clock signal TClock. The transmission link module 110 may output normal data TDATA<m:0> (e.g., (m+1)-bit parallel data) to the transmission D-PHY module 120 for data transmission, where "m" is an integer of at least 1.

The transmission D-PHY module 120 includes first through fourth transmission channel units D1 through D4 or 121 through 124 and a transmission clock generator CLK or 131. In an exemplary embodiment, one or more of 121 through 124 are implemented by a central processing unit, a field programmable gate array, etc.

The transmission clock generator 131 generates and transmits the clock signal CLK to the clock channel 30 and the first through fourth transmission channel units 121 through 124 as well. The transmission clock generator 131 also generates the transmission clock signal TClock and transmits it to the transmission link module 110.

In a normal mode, each of the first through fourth transmission channel units 121 through 124 convert corresponding normal data among the normal data TDATA<m:0> from parallel data to serial data. For instance, each of the first through fourth transmission channel units 121 through 124 may convert parallel data of "k" bits (where "k" is an integer of at least 2) to serial data. When "k" is 6, the first transmission channel unit 121 converts first 6-bit parallel data DATA<5:0> among the normal data TDATA<m:0> to first serial data and outputs the data to the first data channel 41 and the second transmission channel unit 122 converts second 6-bit parallel data DATA<11:6> among the normal data TDATA<m:0> to second serial data and outputs the data to the second data channel 42. The first through fourth transmission channel units 121 through 124 transmit a normal synchronous code HS_sync predetermined for data synchronization before transmitting the normal data TDATA<m:0>.

Figure 4A:
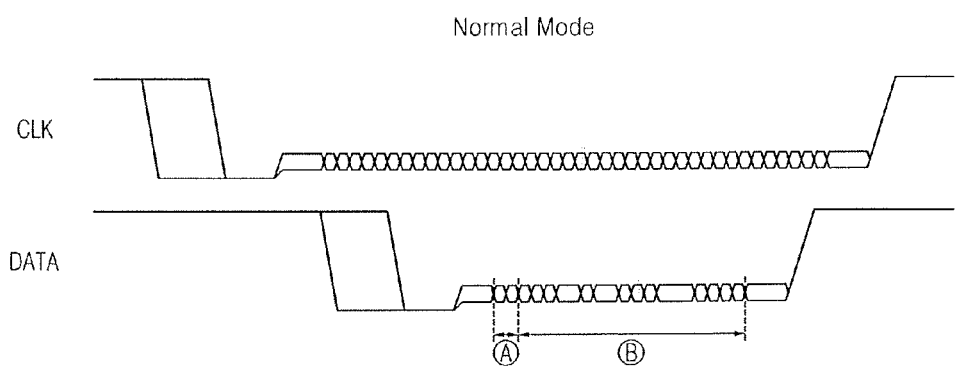
FIG. 4A is a timing chart of a clock signal, a normal synchronous code, and normal data in normal mode.

FIG. 4A is a timing chart of the clock signal CLK, the normal synchronous code HS_sync, and normal data in a normal mode. Referring to FIGS. 2, 3, and 4A, the first through fourth transmission channel units 121 through 124 transmit the normal synchronous code HS_sync (ⒶA in FIG. 4A) to the data channels 41 through 44, respectively, and then transmit serial normal data, i.e., payload data (ⒷB in FIG. 4A) to the data channels 41 through 44, respectively. For the operations in the normal mode, the first transmission channel unit 121 may include a normal synchronous code generator 121-1 and a normal data processor 121-2.

In the normal mode, the normal synchronous code generator 121-1 generates and outputs the normal synchronous code HS_sync to the data channel 41; and the normal data processor 121-2 receives parallel normal data TDATA<k>, converts it to serial normal data TNDs, and outputs the serial normal data TNDs.

In a deskew mode, the first through fourth transmission channel units 121 through 124 generate and output test data TTD, respectively. The deskew mode may be referred to as a skew calibration mode.

The test data TTD is used to correct skew between a clock signal and data and may have a data pattern agreed to in advance between the transmitter 10 and the receiver 20. For instance, the test data TTD may have 0s and 1s alternating for a predetermined length. For example, if the predetermined length is 8, the test data TTD would be "01010101" or "10101010".

The test data TTD may be generated by the first through fourth transmission channel units 121 through 124, respectively, may be read from a memory (not shown), or may be generated and transmitted by the transmission link module 110 to the first through fourth transmission channel units 121 through 124. Each of the first through fourth transmission channel units 121 through 124 transmits a predetermined deskew synchronous code DS_sync before transmitting the test data TTD.

Although not shown in FIG. 2, the transmission D-PHY module 120 may also include a bias circuit and a voltage regulator to generate a voltage and/or current necessary for the operation thereof and a phase locked loop (PLL) to generate a clock signal.

Figure 4B:
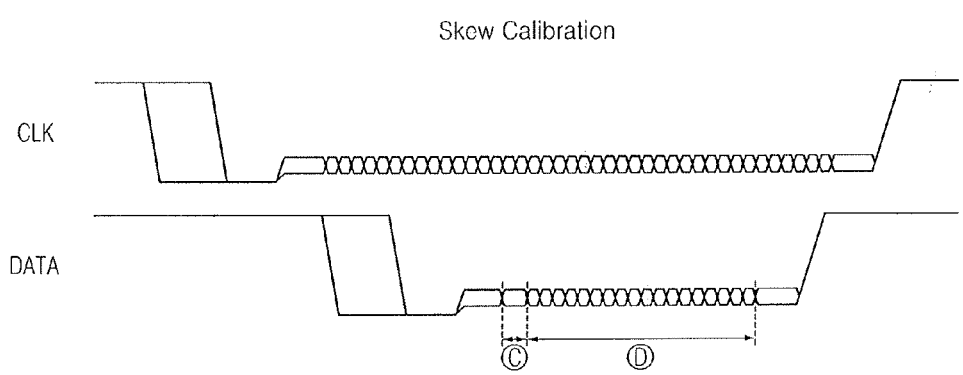
FIG. 4B is a timing chart of a clock signal, a deskew synchronous code, and test data in a deskew mode (or a skew correction mode)

FIG. 4B is a timing chart of the clock signal CLK, the deskew synchronous code DS_sync, and the test data TTD in the deskew mode (or skew correction mode). Referring to FIGS. 2, 3, and 4B, in the deskew mode, the first through fourth transmission channel units 121 through 124 transmit the deskew synchronous code DS_sync (ⒸC in FIG. 4B) to the corresponding data channels 41 through 44, respectively, and then transmit the serial test data TTD (ⒹD in FIG. 4B) to the corresponding data channels 41 through 44, respectively. The test data TTD may have the same pattern (e.g., 01010101 . . . ) as the clock signal CLK, but the inventive concept is not restricted thereto.

For the operations in the deskew mode, the first transmission channel unit 121 may also include a deskew synchronous code generator 121-3 and a test data generator 121-4, as shown in FIG. 3. In the deskew mode, the deskew synchronous code generator 121-3 outputs the deskew synchronous code DS_sync and the test data generator 121-4 outputs the serial test data TTD. The deskew synchronous code generator 121-3 and the test data generator 121-4 operate in response to a deskew enable signal Deskew_En. The deskew enable signal Deskew_En may be enabled based on a deskew request signal (i.e., Deskew_Req) or a PHY ready signal PHY_READY, which will be described later.

Although not shown in FIG. 3, the deskew enable signal Deskew_En may also be supplied to the normal synchronous code generator 121-1 and the normal data processor 121-2. For example, during the deskew mode, the deskew enable signal can be used to enable the deskew synchronous code generator 121-3 and the test data generator 121-4, and disable the normal synchronous code generator 121-1 and the normal data processor 121-2. For example, during the normal mode, the deskew enable signal can be used to disable the deskew synchronous code generator 121-3 and the test data generator 121-4, and enable the normal synchronous code generator 121-1 and the normal data processor 121-2. In an exemplary embodiment, one or more of 121-1, 121-2, 121-3, or 121-4 is implemented as a central processing unit, a field programmable gate array, etc.

While FIG. 3 shows 121-1 and 121-2 as separate units, in an exemplary embodiment their functions are performed by a single unit. While FIG. 3 shows 121-3 and as separate units, in an exemplary embodiment their functions are performed by a single unit. In an exemplary embodiment, the functions performed by the 121-1, 121-2, 121-3 and 121-4 are performed by a single unit.

In an exemplary embodiment of the inventive concept, a deskew mode is automatically started in the transmission D-PHY module 120 during a particular sequence (e.g., a power-up sequence). In other words, the deskew mode may start in response to a self-request in the transmission D-PHY module 120.

In an exemplary embodiment of the inventive concept, the deskew mode starts in response to a request from the transmission link module 110. For instance, a deskew controller 111 included in the transmission link module 110 may generate a Deskew_Req in a particular interval or period according to a predetermined deskew setting value and output the Deskew_Req to the transmission D-PHY module 120. The transmission D-PHY module 120 may enter the deskew mode in response to the Deskew_Req.

The first transmission channel unit 121 may also include a transmission buffer 121-5 that outputs differential signals transmitted to differential data lines that form the first data channel 41.

The second through fourth transmission channel units 122 through 124 may have the same structure as the first transmission channel unit 121 illustrated in FIG. 3. In an exemplary embodiment, the transmission clock signal TClock is a high-speed transmit byte clock signal TxByteClkHS defined in the MIPI standard. In an exemplary embodiment, the Deskew_Req is a TxSkewCalHS signal that is one of the PHY protocol interface (PPI) signals. The normal synchronous code HS_sync may be an HS_sync sequence "00011101" in a normal mode, but is not limited thereto. The deskew synchronous code DS_sync may be a synchronous sequence "11111111_11111111" in a deskew mode, but is not limited thereto. The deskew synchronous code DS_sync may be sequence of all 1s in the deskew mode, but is not limited thereto. When represented in hexadecimal, the deskew synchronous code DS_sync may be sequence of all Fs (e.g., FFFFFFFF).

Figure 5:
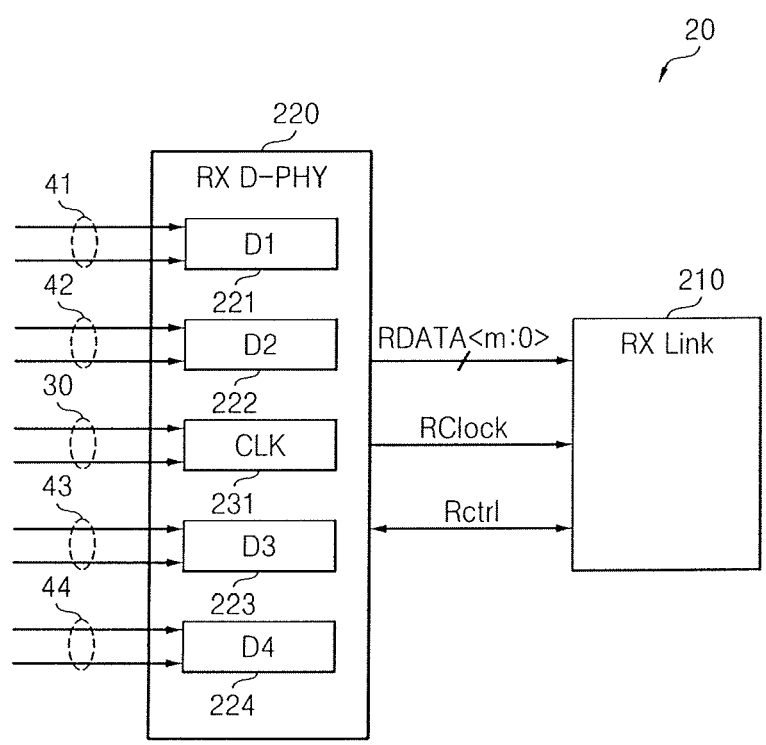
FIG. 5 is a block diagram of a receiver illustrated in FIG. 1 according to an exemplary embodiment of the inventive concept.
Figure 6:
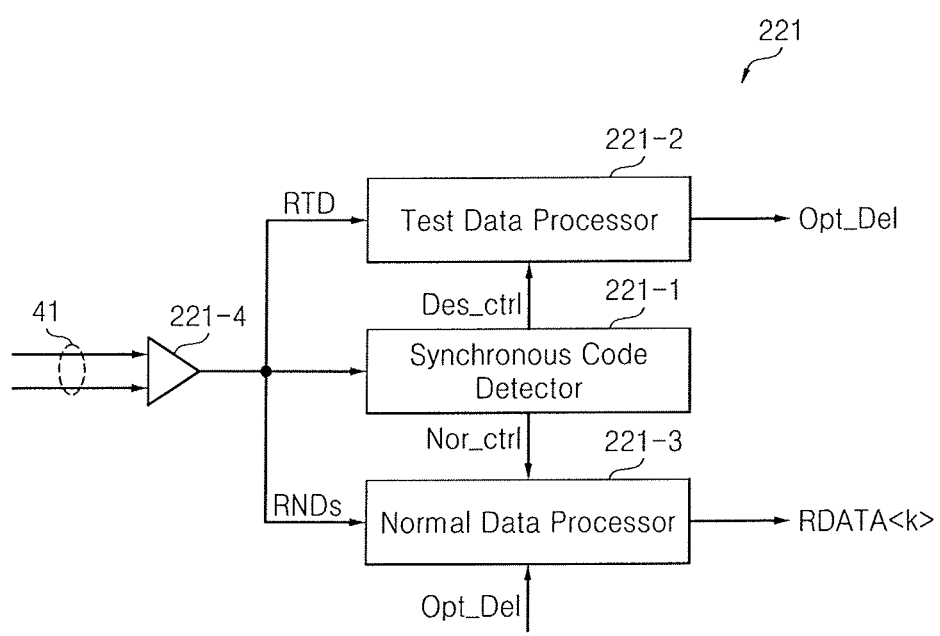
FIG. 6 is a block diagram of a first reception channel unit illustrated in FIG. 5 according to an exemplary embodiments of the inventive concept.

FIG. 5 is a block diagram of the receiver 20 illustrated in FIG. 1 according to an exemplary embodiment of the inventive concept. FIG. 6 is a block diagram of a first reception channel unit 221 illustrated in FIG. 5 according to an exemplary embodiment of the inventive concept. Referring to FIGS. 5 and 6, the receiver 20 includes a reception link module RX Link or 210 and a reception D-PHY module RX D-PHY or 220. In an exemplary embodiment, 210 or 220 are implemented by a central processing unit, a field programmable gate array, etc.

The reception link module 210 controls an operation of the reception D-PHY module 220 using a reception control signal Rctrl. The reception link module 210 receives a reception clock signal RClock from the reception D-PHY module 220 and synchronizes the reception control signal Rctrl with the reception clock signal RClock. In an exemplary embodiment of the inventive concept, the reception clock signal RClock is a high-speed receive byte clock signal RxByteClkHS defined in the MIPI standard. The reception D-PHY module 220 includes first through fourth reception channel units D1 through D4 or 221 through 224 and a clock receiving unit CLK or 231.

The clock receiving unit 231 receives the clock signal CLK through the clock channel 30, generates an internal clock signal (not shown), and sends the internal clock signal to the first through fourth reception channel units 221 through 224. The clock receiving unit 231 also generates the reception clock signal RClock and sends it to the reception link module 210.

The first reception channel unit 221 includes a synchronous code detector 221-1, a test data processor 221-2, a normal data processor 221-3, and a receiving buffer 221-4. In an exemplary embodiment, any of 221-1, 221-2, and 221-3 may be implemented by a central processing unit, a field programmable gate array, etc. While FIG. 6 illustrates 221-1, 221-2, and 222-3 as separate units, in an exemplary embodiment, their functions may be performed by a single unit or a pair of units.

The receiving buffer 221-4 may buffer and output differential signals received through the first data channel 41. The synchronous code detector 221-1 receives a synchronous code through the first data channel 41 and detects whether the synchronous code is the deskew synchronous code DS_sync or the normal synchronous code HS_sync. The synchronous code detector 221-1 outputs a control signal Nor_ctrl for controlling the normal data processor 221-3 to operate in a normal mode when the synchronous code is detected as the normal synchronous code HS_sync and outputs a control signal Des_ctrl for controlling the test data processor 221-2 to operate in a deskew mode when the synchronous code is detected as the deskew synchronous code DS_sync.

In response to the control signal Des_ctrl, the test data processor 221-2 receives the test data TTD through the first data channel 41, detects the amount of skew between the clock signal CLK and the test data TTD using the test data TTD, and determines a deskew delay Opt_Del for reducing the skew. In response to the control signal Nor_ctrl, the normal data processor 221-3 receives serial normal data RNDs through the first data channel 41, delays the serial normal data RNDs according to the deskew delay Opt_Del, and converts the serial normal data RNDs into parallel normal data RDATA<k>.

The second through fourth receiving channel units 222 through 224 may have the same structure as the first receiving channel unit 221 illustrated in FIG. 5.

The first through fourth reception channel units 221 through 224 may operate in a deskew mode or a normal mode according to the synchronous code received through the data channels 41 through 44, respectively. In the deskew mode, the first through fourth reception channel units 221 through 224 receive the test data TTD through the data channels 41 through 44, respectively; detect the amount of skew between the clock signal CLK and the test data TTD using the test data TTD; and determine the deskew delay Opt_Del optimal to the data channels 41 through 44, respectively. The data channels 41 through 44 may have different characteristics, and therefore, the deskew delay Opt_Del may be different among the data channels 41 through 44.

In the normal mode, the first through fourth reception channel units 221 through 224 receive the normal data RNDs through the data channels 41 through 44, respectively; delay the data RNDs by the deskew delay Opt_Del determined in the deskew mode; and then convert the data RNDs to parallel data. As described above, the deskew delay Opt_Del for correcting the skew between the clock signal CLK and received data is obtained for each data channel in a deskew mode and then used in the normal mode, so that the skew in normal data is corrected.

Each of the first through fourth reception channel units 221 through 224 may convert serial normal data of "k" bits (where "k" is an integer of at least 2) to parallel data. For instance, when "k" is 6, the first reception channel unit 221 converts 6-bit serial data received through the first data channel 41 to first parallel data DATA<5:0> and the second reception channel unit 222 converts 6-bit serial data received through the second data channel 42 to second parallel data DATA<11:6>. Parallel data RDATA<m:0> output from the first through fourth reception channel units 221 through 224 is input to the reception link module 210.

Although not shown in FIG. 5, the reception D-PHY module 220 may also include a bias circuit and a voltage regulator to generate a voltage and/or current necessary for the operation thereof.

Figure 7:
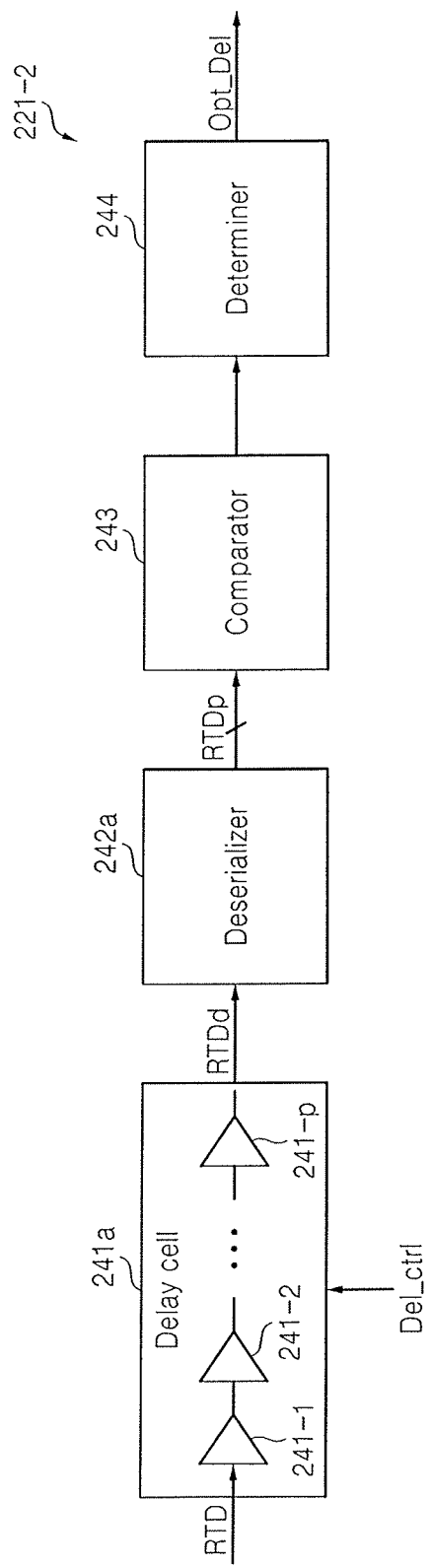
FIG. 7 is a block diagram of a test data processor illustrated in FIG. 6 according to an exemplary embodiment of the inventive concept.

FIG. 7 is a block diagram of the test data processor 221-2 illustrated in FIG. 6 according to an exemplary embodiment of the inventive concept. Referring to FIG. 7, the test data processor 221-2 includes a delay cell circuit 241a, a deserializer 242a, a comparator 243, and a delay determiner 244. The delay cell circuit 241a may include a plurality of unit delay cells 241-1 through 241-p (where "p" is an integer of at least 2) connected in series. The unit delay cells 241-1 through 241-p may have the same or different delay times. In an exemplary embodiment, the delay cell circuit 241 is a programmable digital delay generator.

The delay cell circuit 241a delays serial test data RTD and outputs delayed serial test data RTDd in response to a delay control signal Del_Ctrl. The amount of delay of the test data RTD changes according to the value of the delay control signal Del_Ctrl. For instance, the number of unit delay cells 241-1 through 241-p through which the test data RTD passes may be different depending on the delay control signal Del_Ctrl. In an exemplary embodiment of the inventive concept, the delay control signal Del_Ctrl is a digital signal of a plurality of bits, but the inventive concept is not restricted thereto.

The deserializer 242a converts a delayed test data RTDd output from the delay cell circuit 241a to parallel test data RTDp. The comparator 243 receives the parallel test data RTDp and compares the parallel test data RTDp with a deskew data pattern stored therein in advance.

The delay determiner 244 determines pass or fail according to the comparison result of the comparator 243 and determines the deskew delay Opt_Del using the determination result. In other words, in the deskew mode, test data having a predetermined pattern is transferred between the transmitter 10 and the receiver 20, the transferred test data is compared with a pre-stored deskew data pattern, and pass or fail is determined based on the comparison.

The delay determiner 244 may adjust the value of the delay control signal Del_Ctrl. For instance, the delay determiner 244 may sequentially increase the value of the delay control signal Del_Ctrl by 1 unit of delay time from an initial value.

The amount of delay of the test data RTD may change according to the delay control signal Del_Ctrl and determination of pass or fail may also change. Therefore, when the delay in the delay cell circuit 241a is increased by a unit delay time by sequentially increasing the delay control signal Del_Ctrl; fail, pass and fail may repeatedly occur according to the amount of delay.

The delay determiner 244 may determine the amount of delay corresponding to the center of a pass period as the deskew delay Opt_Del. In other words, a value of the delay control signal Del_Ctrl corresponding to the center of the pass period may be selected. For instance, when fail is determined at a delay of 0, 1, or 2, pass is determined at a delay of 3, 4, 5, 6, or 7, and fail is determined at a delay of 8 or 9; a median value "5" in the pass period from 3 to 7 may be selected as the deskew delay Opt_Del. Therefore, the delay control signal Del_Ctrl or the deskew delay Opt_Del has a value that minimizes the skew between data and a clock signal. In an exemplary embodiment, any of 241a, 242a, 243, or 244 may be implemented by a central processing unit, a field programmable gate array, etc.

Figure 8:
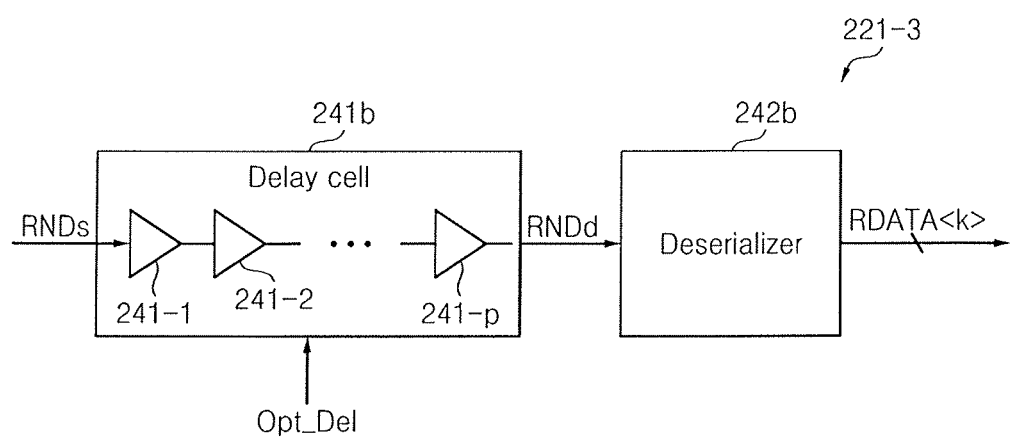
FIG. 8 is a block diagram of a normal data processor illustrated in FIG. 6 according to an exemplary embodiment of the inventive concept.

FIG. 8 is a block diagram of the normal data processor 221-3 illustrated in FIG. 6 according to an exemplary embodiment of the inventive concept. Referring to FIG. 8, the normal data processor 221-3 may include a delay cell circuit 241b and a deserializer 242b. The delay cell circuit 241b and the deserializer 242b may have the same structure and function as the deserializer 241a and the deserializer 242a illustrated in FIG. 7. However, the delay cell circuit 241b delays the normal data RNDs and outputs the delayed normal data RNDd according to the deskew delay Opt_Del determined in the deskew mode and the deserializer 242b converts the delayed normal data RNDd output from the delay cell circuit 241b to the parallel normal data RDATA<k>.

In an exemplary embodiment of the inventive concept, the delay cell circuit 241a of the test data processor 221-2 and the delay cell circuit 241b of the normal data processor 221-3 are implemented as a common delay cell circuit and the deserializer 242a of the test data processor 221-2 and the deserializer 242b of the normal data processor 221-3 are implemented as a common deserializer.

As described above, the transmitter 10 informs the receiver 20 of the start of the deskew mode and conversion to the normal mode using different synchronous codes. In other words, the transmitter 10 uses a particular deskew synchronous code to notify the receiver 20 about the deskew mode. In the deskew mode, test data instead of normal data is used.

Figure 9:
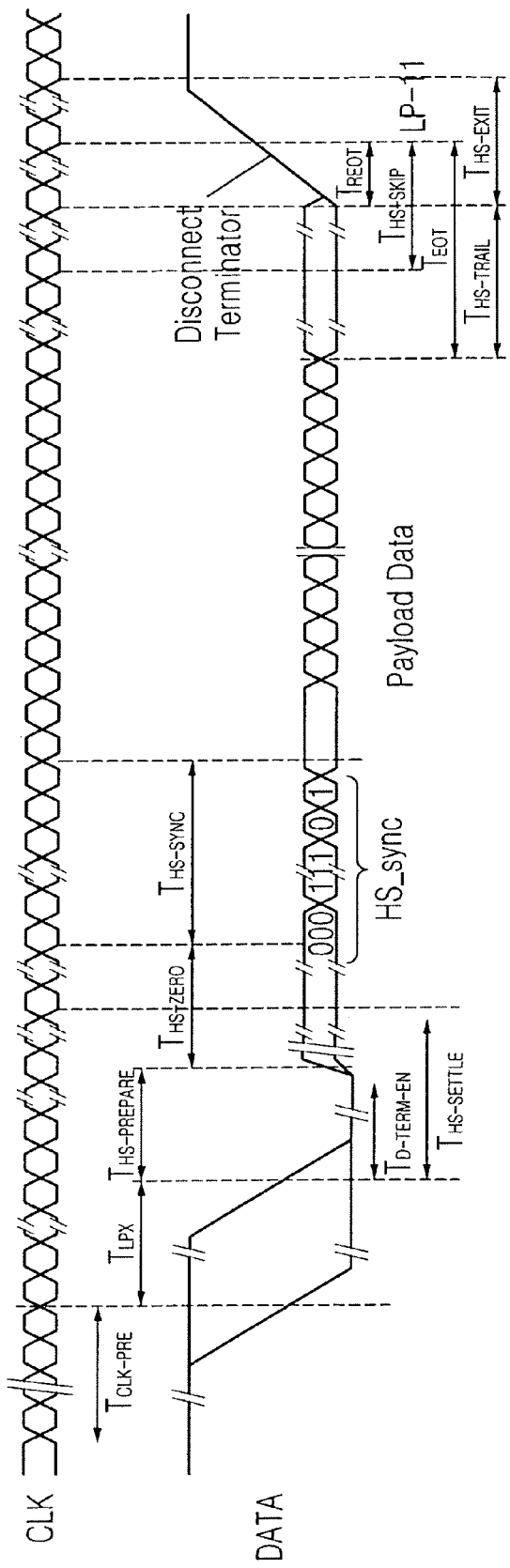
FIG. 9 is a timing chart of signals in a normal mode of a transmitter according to an exemplary embodiments of the inventive concept.

FIG. 9 is a timing chart of signals in a normal mode of a transmitter (e.g., 10) according to an exemplary embodiment of the inventive concept. Referring to FIG. 9, a start-of-transmission sequence is performed according to a MIPI standard before normal data is transmitted. In other words, the transmitter transits from a stop state (or LP-11) to a high-speed (HS) mode through the start-of-transmission sequence.

For instance, an HS request state (or LP-01) starts in a period $T_{LPX}$, a bridge state (or LP-00) starts in a period $T_{HS\text{-}PREPARE}$, HS-0 starts during a period $T_{HS\text{-}ZERO}$, and the normal synchronous code HS_sync (e.g., "00011101") is transmitted during a period $T_{HS\text{-}SYNC}$. Normal data which is HS payload data is transmitted following the normal synchronous code HS_sync.

As described above, when the transmitter switches from an LP mode (or stop state) to an HS mode, it transmits the normal synchronous code HS_sync of "00011101" defined in the standard to a receiver through a data channel. When the receiver detects the normal synchronous code HS_sync of "00011101", it captures and processes the normal data, i.e., payload data transmitted following the normal synchronous code HS_sync.

After the normal data is transmitted, an end-of-transmission sequence is performed according to the MIPI standard. In other words, the transmitter switches from HS mode to LP mode through the end-of-transmission sequence.

Figure 10:
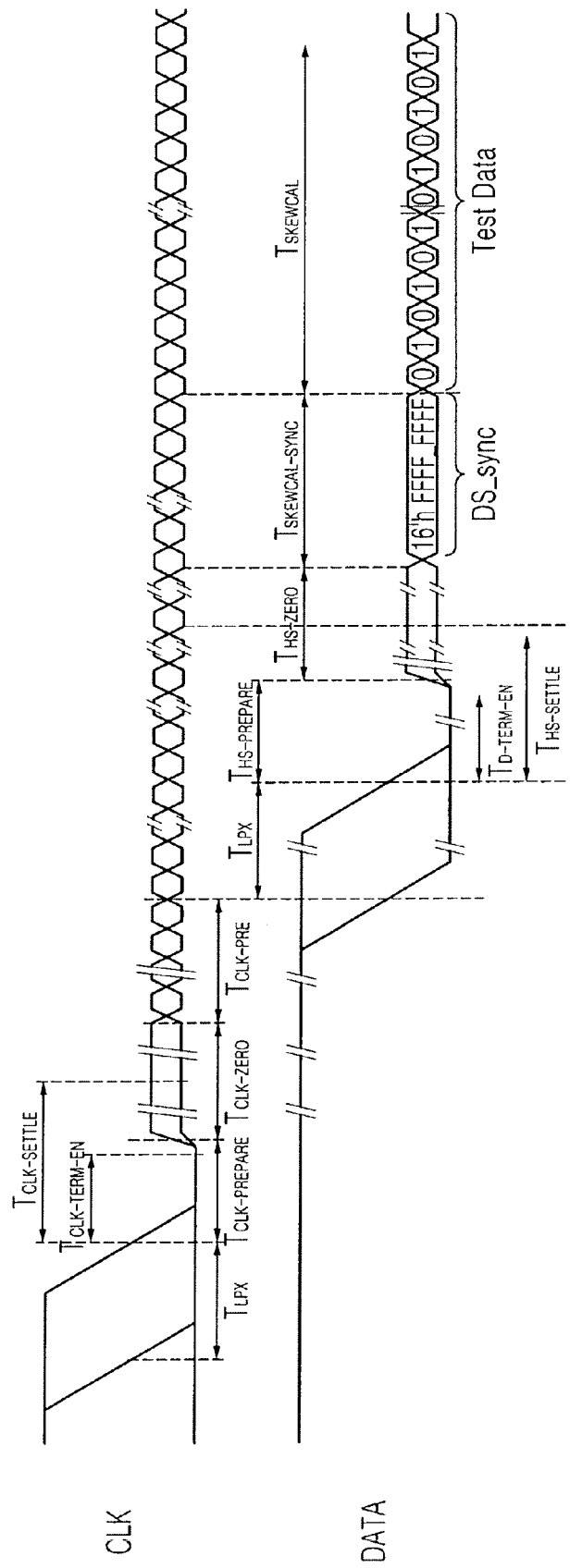
FIG. 10 is a timing chart of signals in a deskew mode of a transmitter according to an exemplary embodiment of the inventive concept.

FIG. 10 is a timing chart of signals in a deskew mode of a transmitter (e.g. 10) according to an exemplary embodiment of the inventive concept. Referring to FIG. 10, to enter the deskew mode, the start-of-transmission sequence is performed according to the MIPI standard like in a normal mode illustrated in FIG. 9. However, the predetermined deskew synchronous code DS_sync (e.g., "FFFFFFFF") instead of the normal synchronous code HS_sync of "00011101" is used to start the deskew mode.

The deskew synchronous code DS_sync of "FFFFFFFF" is transmitted during a period $T_{SKEWCAL-SYNC}$ instead of the period $T_{HS-SYNC}$ in the normal mode and then test data (e.g., "0101010 . . . ") is transmitted during a period $T_{SKEWCAL}$. In other words, when the transmitter switches from LP mode (or stop state) to HS mode, the transmitter transmits the deskew synchronous code DS_sync of "FFFFFFFF" instead of the normal synchronous code HS_sync of "00011101" and then transmits test data to a receiver. When the receiver detects the deskew synchronous code DS_sync, it starts a skew correction mode (i.e., a deskew mode) in response to the deskew synchronous code DS_sync.

Figure 11A:
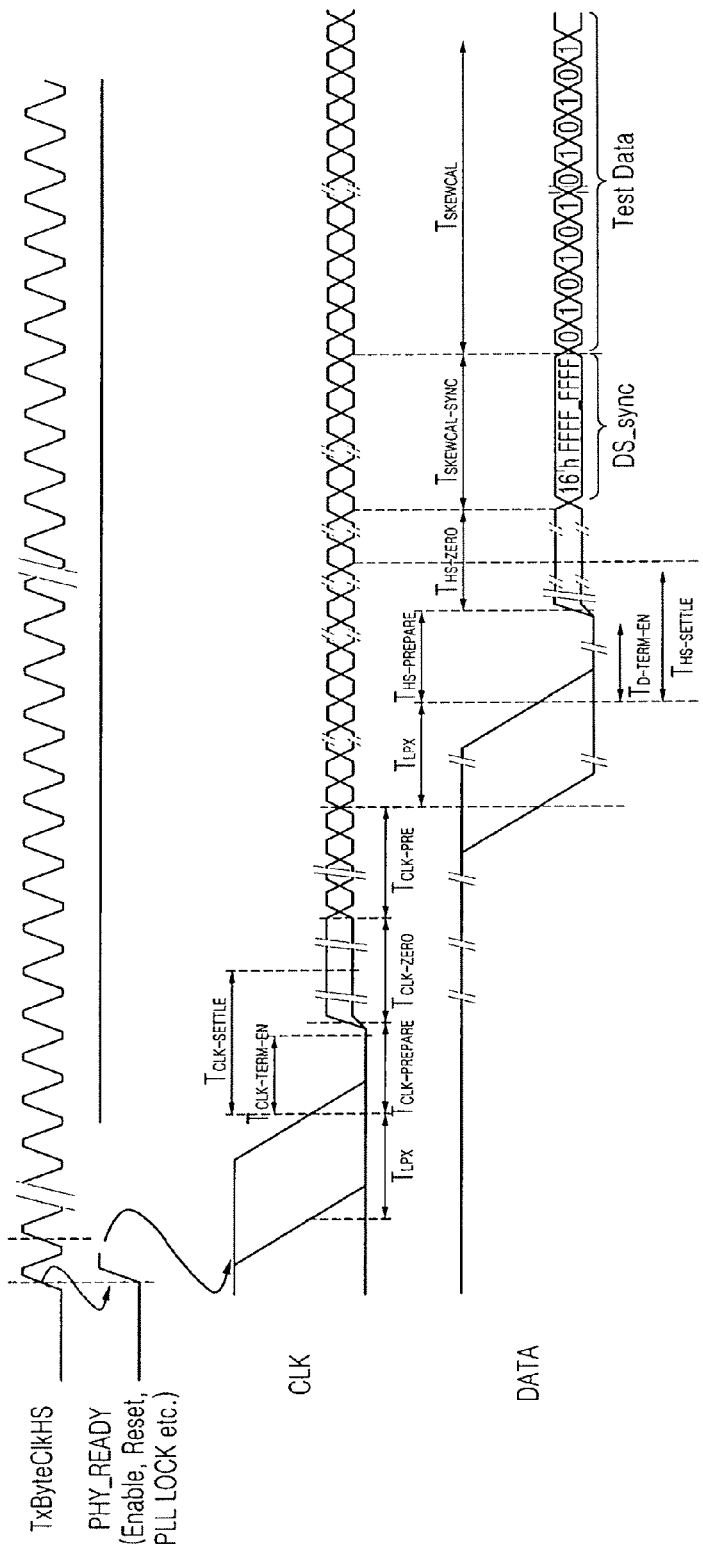

FIG. 11A is a signal timing chart for explaining a method of starting a deskew mode in the transmitter 10 according to an exemplary embodiments of the inventive concept. Referring to FIG. 11A, the deskew mode may be performed in a power-up sequence. During the power-up sequence, the transmission link module 110 enables the PHY ready signal PHY_READY sent to the transmission D-PHY module 120. The transmission D-PHY module 120 operates in a deskew mode in response to the enabled PHY ready signal PHY_READY. Accordingly, the transmission D-PHY module 120 generates and outputs the deskew synchronous code DS_sync to the at least one data channel 40 in response to the enabled PHY ready signal PHY_READY and then outputs test data following the deskew synchronous code DS_sync. In an exemplary embodiment of the inventive concept, the PHY ready signal PHY_READY is a PPI signal that is applied by the transmission link module 110 to enable the transmission D-PHY module 120. In an exemplary embodiment of the inventive concept, the PHY ready signal PHY_READY is a signal that is internally generated in the transmission link module 110 in response to a PPI signal applied to the transmission link module 110.

FIG. 11B is a signal timing chart for explaining a method of starting a deskew mode in the transmitter 10 according to an exemplary embodiment of the inventive concept. The signal timing chart illustrated in FIG. 11B is similar to that illustrated in FIG. 11A, and therefore, differences therebetween will be mainly described in order to avoid redundancy.

While the transmission D-PHY module 120 enters the deskew mode in response to the PHY ready signal PHY_READY enabled in the power-up sequence in the embodiment illustrated in FIG. 11A, the transmission D-PHY module 120 enters the deskew mode in response to a Deskew_Req received from the transmission link module 110 in the embodiment illustrated in FIG. 11B. It is assumed in at least one embodiment of the inventive concept that Deskew_Req is TxSkewCalHS complying with the MIPI standard. In order to enter the deskew mode, the deskew controller 111 of the transmission link module 110 outputs Deskew_Req to the transmission D-PHY module 120 and the transmission D-PHY module 120 transmits the predetermined deskew synchronous code DS_sync (e.g., "FFFFFFFF") instead of the normal synchronous code HS_sync (e.g., "00011101") when switching from the LP mode to the HS mode in response to the Deskew_Req and then transmits test data.

The deskew controller 111 may periodically or non-periodically generate the Deskew_Req according to a deskew setting value set by a user. A particular register (not shown) may be used to set the deskew setting value. The deskew setting value may be a period of a deskew mode or the number of deskew modes per unit time, but the inventive concept is not restricted thereto. A user may operate the deskew mode for each frame by adjusting the deskew setting value. For instance, the user may set the deskew setting value so that Deskew_Req is generated in a vertical blank period between frames. For example, when frames of image data are transmitted by the transmitter 10, and a vertical blank period is present between the frames where the image data is blank (e.g., all black), the adjustment of a skew between the image data and a clock signal can be performed during at least one of the vertical blanking periods. The deskew mode may be executed in the power-up sequence, for each row or frame, or in a predetermined period by using the deskew setting value.

Since the execution period of the deskew mode can be set as described above, skew can be effectively corrected even when the amount of skew changes in one data channel due to the change in characteristics depending on operating temperature or operating time.

Figure 12:
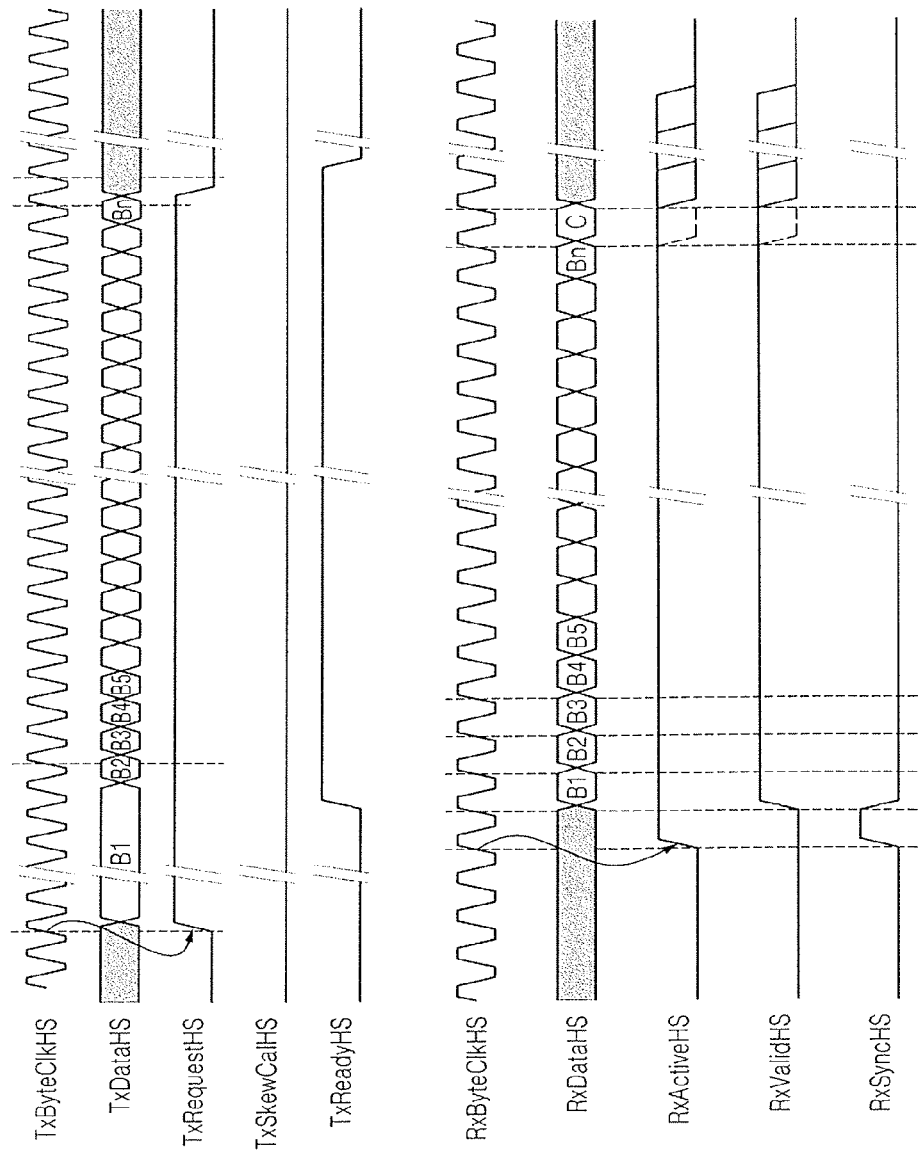
FIG. 12 is a diagram of PHY protocol interface (PPI) signals in a normal mode of a high-speed interface system according to an exemplary embodiment of the inventive concept.
Figure 13:
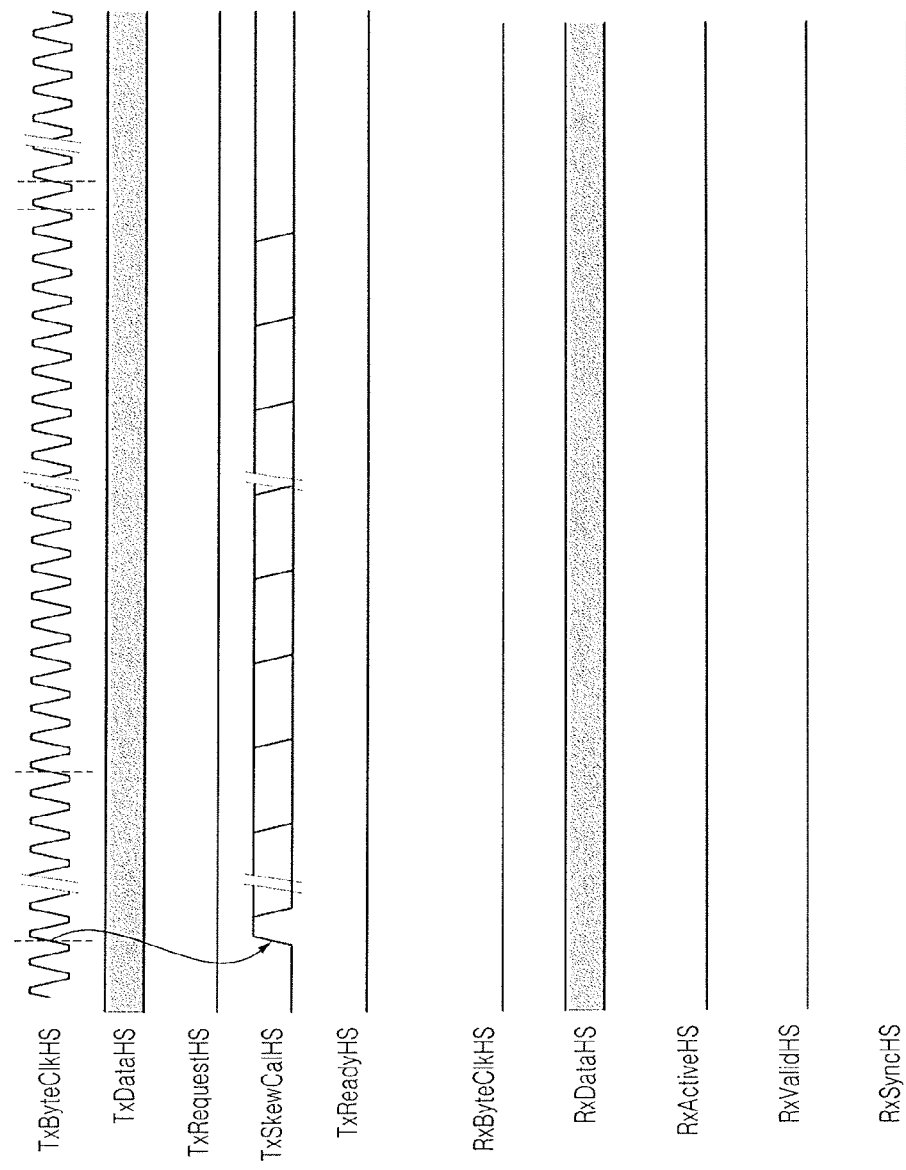
FIG. 13 is a diagram of PPI signals in a deskew mode of a high-speed interface system according to an exemplary embodiment of the inventive concept.

FIG. 12 is a diagram of PPI signals in a normal mode of a high-speed interface system according to an exemplary embodiment of the inventive concept. FIG. 13 is a diagram of PPI signals in a deskew mode of a high-speed interface system according to an exemplary embodiment of the inventive concept. The signals, i.e., TxByteClkHS, TxDataHS, TxRequestHS, TxSkewCalHS, TxReadyHS, RxByteClkHS, RxDataHS, RxActiveHS, RxValidHS, and RxSyncHS illustrated in FIGS. 12 and 13 are defined in the MIPI standard.

The PPI signals in the normal mode may appear as shown in FIG. 12. For instance, TxRequestHS may be enabled to a high level of "1" in synchronization with a HS transmission byte clock signal (i.e., TxByteClkHS) and normal data (i.e., HS transmission data TxDataHS). Meanwhile, TxSkewCalHS (i.e., the deskew request signal Deskew_Req) is maintained at a low level of "0" in the normal mode.

The PPI signals in the deskew mode may appear as shown in FIG. 13. For instance, Deskew_Req (i.e., TxSkewCalHS) may be enabled to a high level of "1" in synchronization with the HS transmission byte clock signal (i.e., TxByteClkHS). In an exemplary embodiment, TxReadyHS, RxActiveHS, RxValidHS, and RxSyncHS are maintained at a low level of "0" in the deskew mode.

Figure 14:
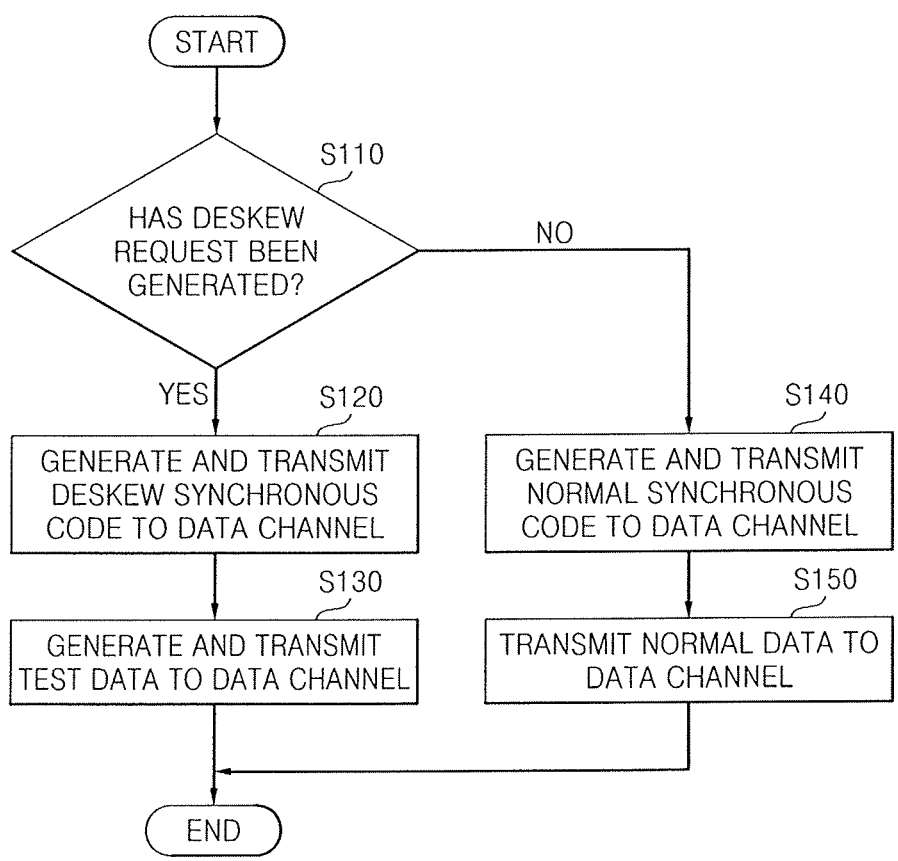
FIG. 14 is a flowchart of a method of operating a transmitter according to an exemplary embodiment of the inventive concept.

FIG. 14 is a flowchart of a method of operating the transmitter 10 according to an exemplary embodiment of the inventive concept. Referring to FIG. 14, the transmission D-PHY module 120 of the transmitter 10 checks whether Deskew_Req has been generated by the transmission link module 110 in operation S110. When Deskew_Req has been generated (i.e., in case of YES in operation S110), the transmission D-PHY module 120 enters the deskew mode and transmits a deskew synchronous code to a data channel in operation S120. Thereafter, the transmission D-PHY module 120 transmits test data following the deskew synchronous code in operation S130.

When the transmission D-PHY module 120 of the transmitter 10 does not receive the Deskew_Req from the transmission link module 110, for instance, when it receives a HS transmission request signal (i.e., TxRequestHS) in operation S110 (in case of NO), the transmission D-PHY module 120 enters the normal mode and transmits a normal synchronous code to a data channel in operation S140 and transmits normal data following the normal synchronous code in operation S150.

Figure 15:
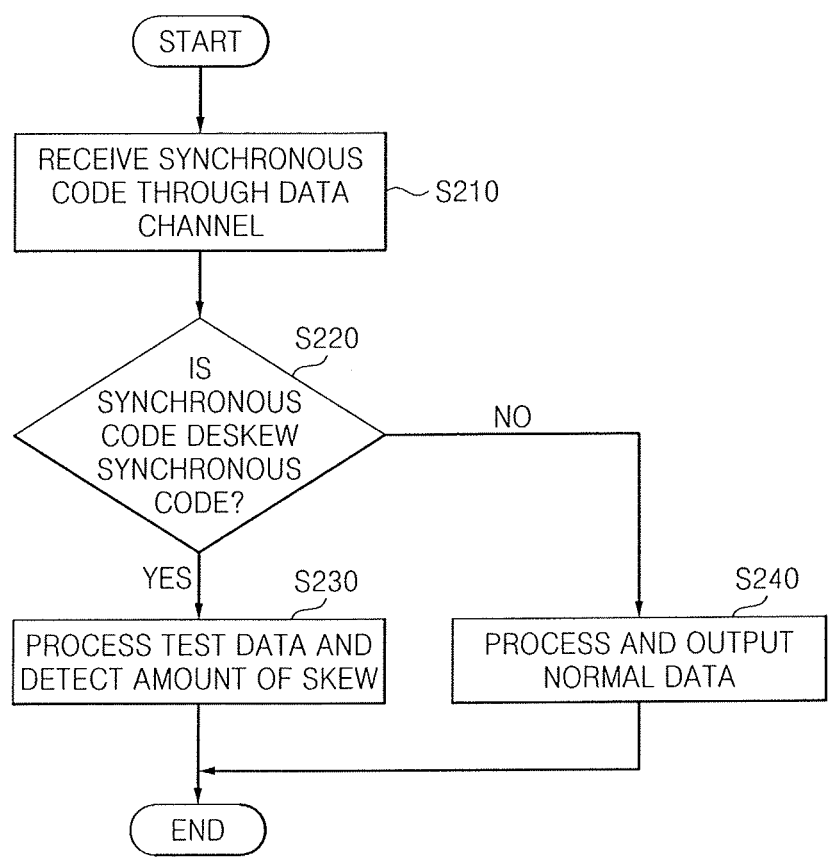
FIG. 15 is a flowchart of a method of operating a receiver according to an exemplary embodiment of the inventive concept.

FIG. 15 is a flowchart of a method of operating the receiver 20 according to an exemplary embodiment of the inventive concept. Referring to FIG. 15, the receiver 20 receives a synchronous code through a data channel in operation S210 and determines whether the synchronous code is a deskew synchronous code in operation S220.

When it is determined that the synchronous code is the deskew synchronous code, the receiver 20 detects the amount of skew between a clock signal and test data using the test data in operation S230. When it is determined that the synchronous code is a normal synchronous code, the receiver 20 processes and outputs normal data in operation S240.

As described above, the normal synchronous code HS_sync of "00011101" defined in the standard is used in the normal mode and the predetermined deskew synchronous code DS_sync instead of the normal synchronous code HS_sync is used in deskew mode in at least one embodiment of the inventive concept. In other words, the transmitter 10 transmits the normal synchronous code HS_sync of "00011101" in the normal mode and generates and transmits the deskew synchronous code DS_sync instead of the normal synchronous code HS_sync in the deskew mode. The receiver 20 determines normal mode or deskew mode according to the pattern of a received synchronous code. In an exemplary embodiment of the inventive concept, the receiver 20 enters the deskew mode when receiving the deskew synchronous code DS_sync (e.g., "FFFFFFFF") instead of the normal synchronous code HS_sync of "00011101".

Therefore, the high-speed interface system 1 may operate in deskew mode any time when a user wants. The user may set the start point or the period of deskew mode by setting a particular register value that is used to set a deskew setting value.

Figure 16:
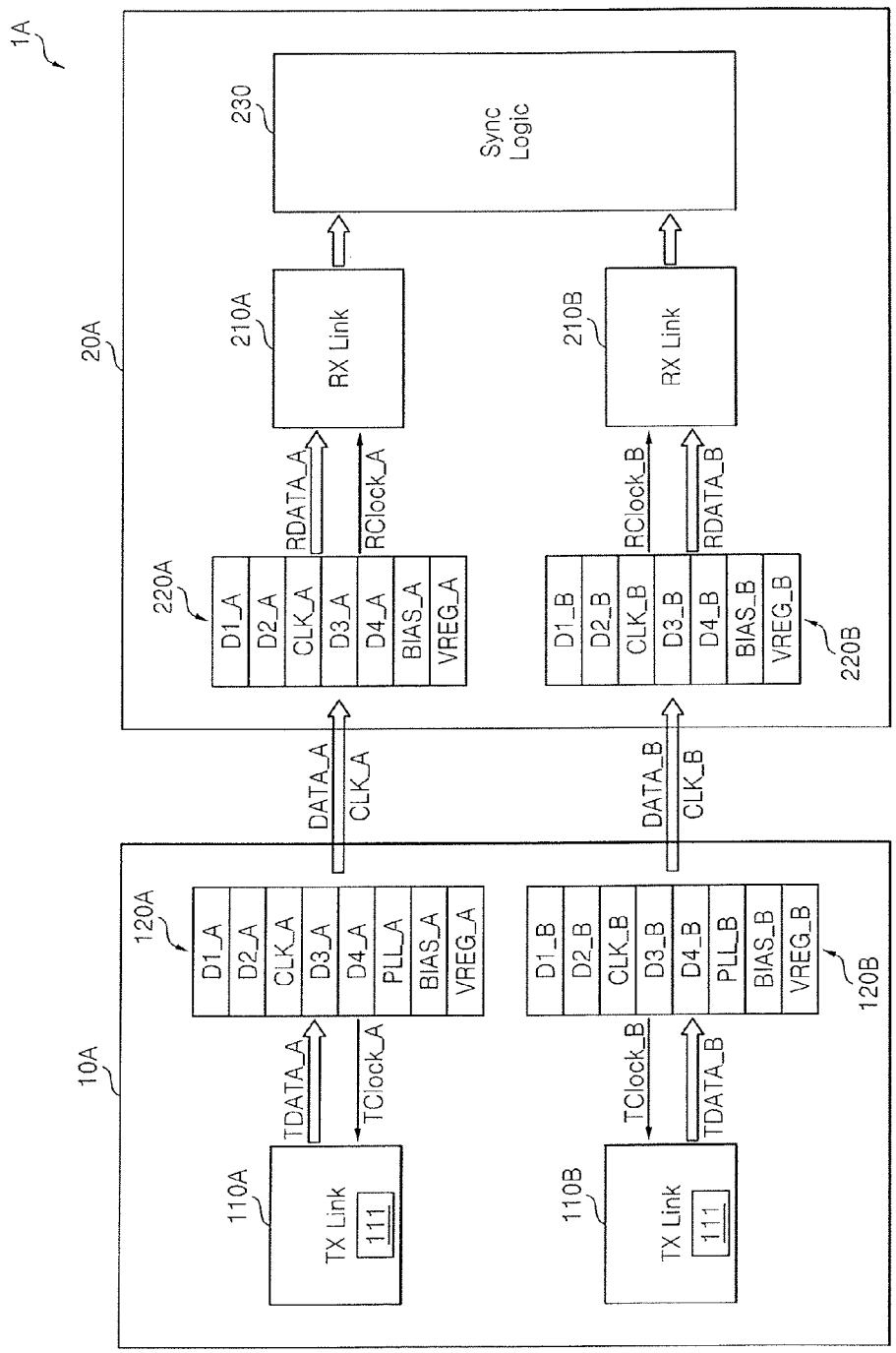
FIG. 16 is a block diagram of a high-speed interface system according to an exemplary embodiment of the inventive concept.

FIG. 16 is a block diagram of a high-speed interface system 1A according to an exemplary embodiment of the inventive concept. Referring to FIG. 16, similar to the high-speed interface system 1 illustrated in FIG. 1, the high-speed interface system 1A includes a transmitter 10A, a receiver 20A, a clock channel, and a plurality of data channels. The transmitter 10A includes first and second transmission link modules 110A and 110B and first and second transmission D-PHY modules 120A and 120B.

The first and second transmission link modules 110A and 110B control the operation of the first and second transmission D-PHY modules 120A and 120B, respectively. The first and second transmission link modules 110A and 110B may have the same structure and function as the transmission link module 110 illustrated in FIG. 2 and the first and second transmission D-PHY modules 120A and 120B may have the same structure and function as the transmission D-PHY module 120 illustrated in FIG. 2.

Bias circuits BIAS_A and BIAS_B and voltage regulators VREG_A and VREG_B included in the first and second transmission D-PHY modules 120A and 120B, respectively, generate voltage and/or current necessary for the operation of the first and second transmission D-PHY modules 120A and 120B, respectively. PLL circuits PLL_A and PLL_B generate a clock signal necessary for the operation of the first and second transmission D-PHY modules 120A and 120B, respectively.

While the transmitter 10 illustrated in FIG. 2 includes one transmission link module 110 and one transmission D-PHY module 120, the transmitter 10A illustrated in FIG. 16 includes two transmission link modules 110A and 110B and two transmission D-PHY modules 120A and 120B.

The receiver 20A includes first and second reception link modules 210A and 210B, first and second reception D-PHY modules 220A and 220B, and a sync logic unit 230. The first and second reception link modules 210A and 210B control the operation of the first and second reception D-PHY modules 220A and 220B, respectively. The first and second reception link modules 210A and 210B may have the same structure and function as the reception link module 210 illustrated in FIG. 5 and the first and second reception D-PHY modules 220A and 220B may have the same structure and function as the reception D-PHY module 220 illustrated in FIG. 5.

Bias circuits BIAS_A and BIAS_B and voltage regulators VREG_A and VREG_B included in the first and second reception link modules 210A and 210B, respectively, generate voltage and/or current necessary for the operation of the first and second reception D-PHY modules 220A and 220B, respectively.

While the receiver 20 illustrated in FIG. 5 includes one reception link module 210 and one reception D-PHY module 220, the receiver 20A illustrated in FIG. 16 includes two reception link modules 210A and 210B and two reception D-PHY modules 220A and 220B. In addition, unlike the receiver 20, the receiver 20A also include the sync logic unit 230 that combines data output from the first reception link module 210A and data output from the second reception link module 210B.

Consequently, the transmitter 10A and the receiver 20A illustrated in FIG. 16 have the same function as the transmitter 10 illustrated in FIG. 2 and the receiver 20 illustrated in FIG. 5, but the number of data channels is doubled in the embodiment illustrated in FIG. 16. In other words, while there are four data channels and one clock channel in the embodiments illustrated in FIGS. 2 and 5, there are eight data channels and two clock channels in the embodiments illustrated in FIG. 16.

Figure 17:
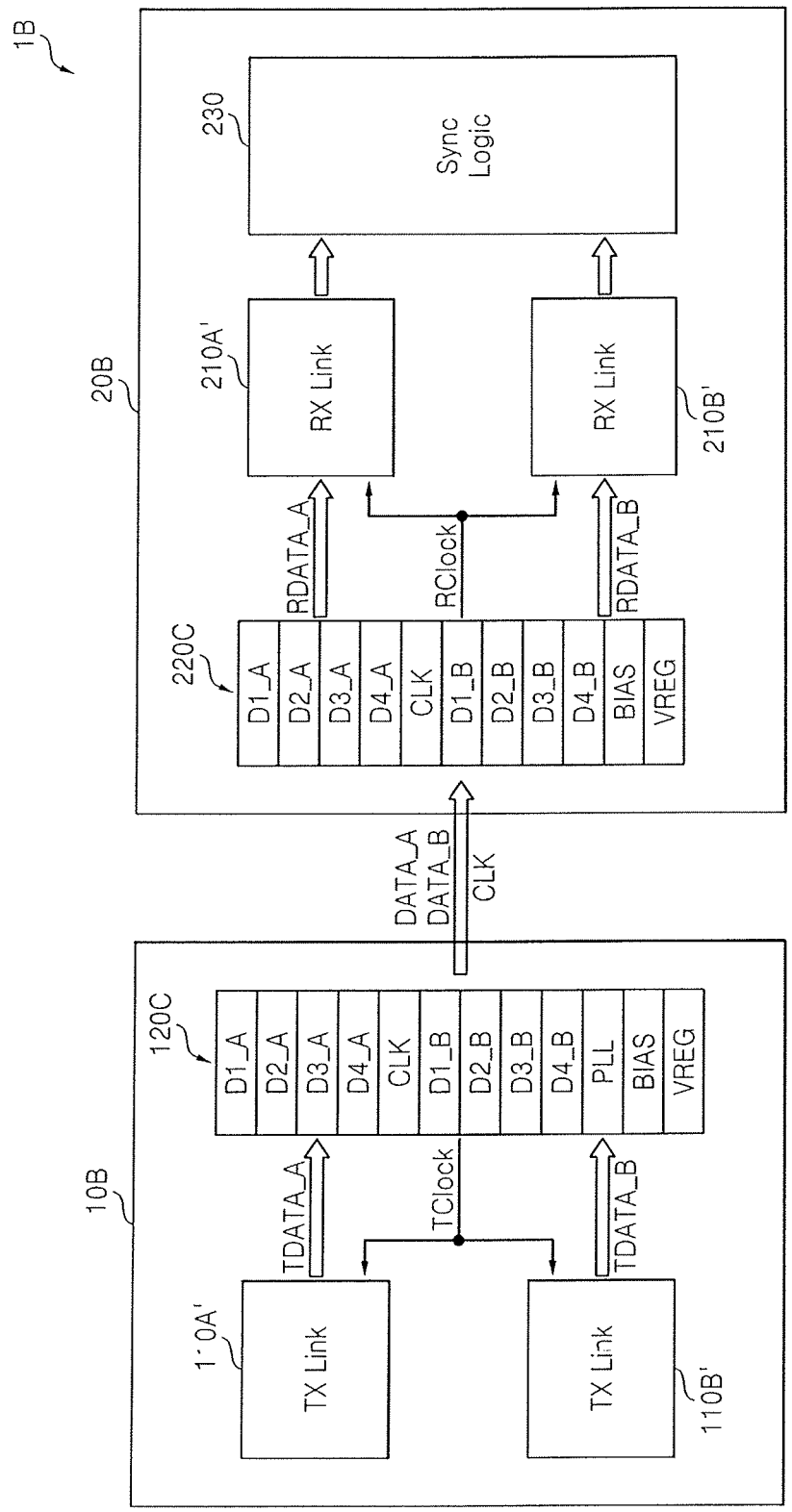
FIG. 17 is a block diagram of a high-speed interface system according to an exemplary embodiment of the inventive concept.

FIG. 17 is a block diagram of a high-speed interface system 1B according to an exemplary embodiment of the inventive concept. The high-speed interface system 1B illustrated in FIG. 17 has a similar structure to the high-speed interface system 1A illustrated in FIG. 16, and therefore, differences therebetween will be mainly described. The transmitter 10B illustrated in FIG. 17 includes two transmission link modules 110A' and 110B'. The receiver 20B includes first and second reception link modules 210A' and 210B'.

In the high-speed interface system 1A illustrated in FIG. 16, the bias circuits BIAS_A and BIAS_B, the voltage regulators VREG_A and VREG_B, the PLL circuits PLL_A and PLL_B, and clock generators CLK_A and CLK_B are provided for the D-PHY modules 120A, 120B, 220A, and 220B, respectively. However, in the high-speed interface system 1B illustrated in FIG. 17, one bias circuit BIAS, one voltage regulator VREG, one PLL circuit PLL, and one clock generator CLK are provided for each of D-PHY modules 120C and 220C.

Accordingly, while there are eight data channels and two clock channels in the embodiments illustrated in FIG. 16, there are eight data channels and one clock channel in the embodiments illustrated in FIG. 17. FIGS. 16 and 17 show examples where the number of data channels is extended to eight, but the number of data channels may change.

Since there is no protocol that can deskew a clock signal and data in a conventional HS data interface, it is difficult to extend a data channel. When the data channel is extended, the skew between the clock signal and the data is highly likely to increase, but there have been no previous methods of correcting the skew, and therefore, the number of data channels has been restricted.

However, at least one embodiment of the inventive concept provides a protocol that can deskew a clock signal and data in HS data interface, so that the skew between the clock signal and the data is reduced. As a result, the number of data channels can be extended.

Figure 18:
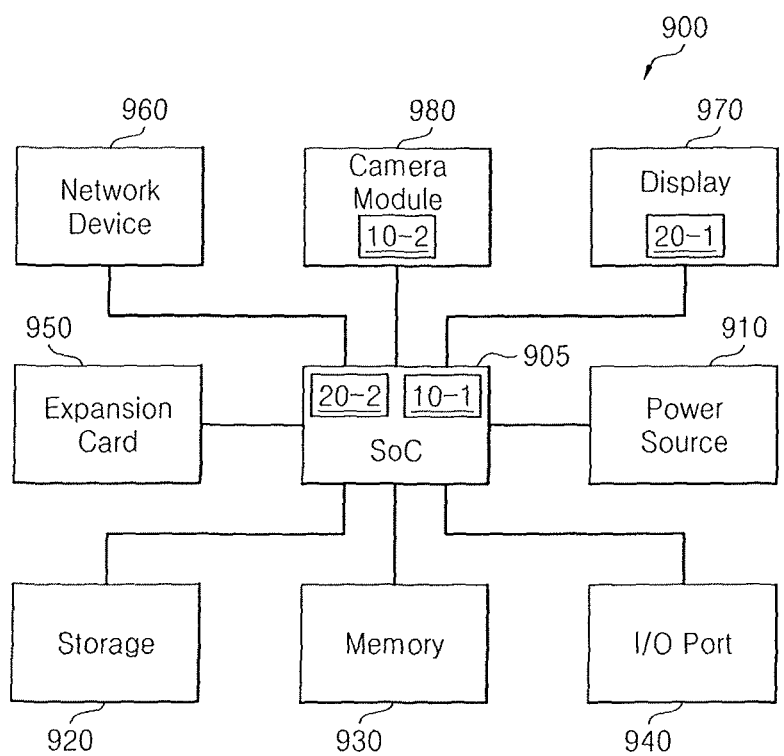
FIG. 18 is a block diagram of en electronic system according to an exemplary embodiment of the inventive concept.

FIG. 18 is a block diagram of en electronic system 900 according to an exemplary embodiment of the inventive concept. Referring to FIG. 18, the electronic system 900 may be implemented as a personal computer (PC), a data server, or a portable electronic device. The portable electronic device may be a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

The electronic system 900 may include a system on chip (SoC) 905, a power source 910, a storage 920, a memory 930, an input/output (I/O) port 940, an expansion card 950, a network device 960, and a display 970. The electronic system 900 may also include a camera module 980.

The SoC 905 may include a first transmitter 10-1 and a second receiver 20-2. The SoC 905 may control the operation of at least one of the elements 910 through 980.

The power source 910 may supply an operating voltage to at least one of the elements 905 and 920 through 980. The storage 920 may be implemented as a hard disk drive (HDD) or a solid state drive (SSD).

The memory 930 may be implemented as volatile or non-volatile memory. A memory controller (not shown) that controls a data access operation, e.g., a read operation, a write operation (or a program operation), or an erase operation, on the memory 930 may be integrated into or embedded in the SoC 905. Alternatively, the memory controller may be provided between the SoC 905 and the memory 930.

The storage 920 may store programs or data and may be implemented as an embedded multimedia card (eMMC). The memory 930 may store programs or data and may be implemented as volatile or non-volatile memory. When the memory is implemented as non-volatile memory, the memory may be implemented as the eMMC.

The I/O port 940 receives data transmitted to the electronic system 900 or transmits data from the electronic system 900 to an external device. For instance, the I/O port 940 may be a port for connection with a pointing device such as a computer mouse, a port for connection with a printer, or a port for connection with a universal serial bus (USB) drive.

The expansion card 950 may be implemented as a secure digital (SD) card or an MMC. The expansion card 950 may be a subscriber identity module (SIM) card or a universal SIM (USIM) card.

The network device 960 enables the electronic system 900 to be connected with a wired or wireless network. The display 970 displays data output from the storage 920, the memory 930, the I/O port 940, the expansion card 950, or the network device 960. The display 970 may include the first receiver 20-1.

The camera module 980 is a module that can convert an optical image into an electrical image. Accordingly, the electrical image output from the camera module 980 may be stored in the storage 920, the memory 930, or the expansion card 950. In addition, the electrical image output from the camera module 980 may be displayed through the display 970. The camera module 980 may include the second transmitter 10-2.

Each of the first and second transmitters 10-1 and 10-2 may be the transmitter 10, 10A, or 10B illustrated in FIG. 2, 16, or 17, respectively. Each of the first and second receivers 20-1 and 20-2 may be the receiver 20, 20A, or 20B illustrated in FIG. 5, 16, or 17.

Figure 19:
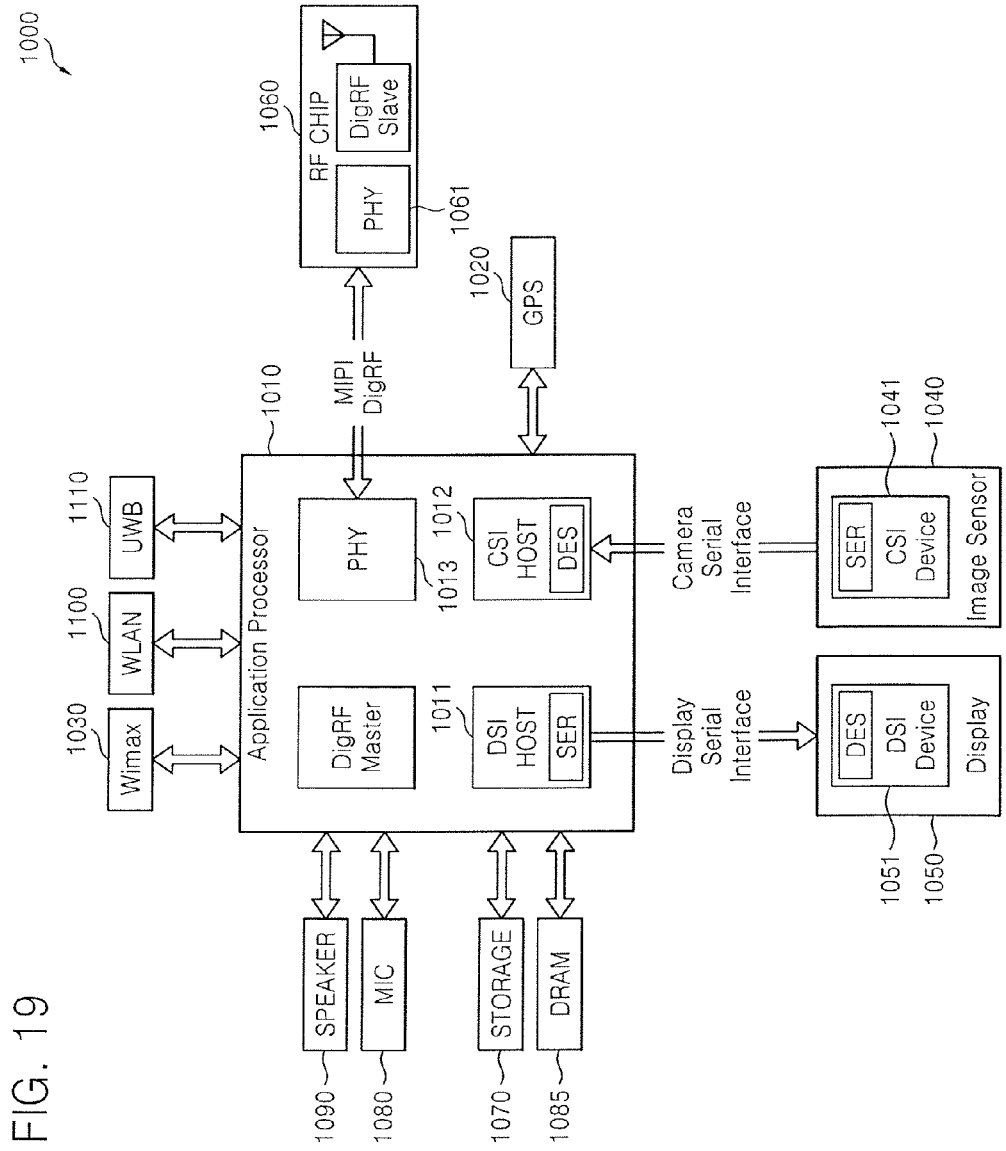
FIG. 19 is a block diagram of an electronic system including an image sensor illustrated in FIG. 1 according to an exemplary embodiment of the inventive concept.

FIG. 19 is a block diagram of an electronic system including an image sensor illustrated in FIG. 1 according to an exemplary embodiment of the inventive concept. Referring to FIGS. 1 and 19, the electronic system 1000 may be implemented by a data processing apparatus, such as a mobile phone, a personal digital assistant (PDA), a portable media player (PMP), an IP TV, or a smart phone that can use or support the MIPI interface.

The electronic system 1000 includes an application processor 1010, an image sensor 1040 and a display 1050.

A camera serial interface (CSI) host 1012 included in the application processor 1010 performs serial communication with a CSI device 1041 included in the image sensor 100 through CSI. For example, an optical de-serializer (DES) may be implemented in the CSI host 1012, and an optical serializer (SER) may be implemented in the CSI device 1041.

A display serial interface (DSI) host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY 1061 of the RF chip 1060 communicate data with each other according to a MIPI DigRF standard. The electronic system 1000 may further include at least one element among a GPS 1020, a storage device 1070, a microphone 1080, a DRAM 1085 and a speaker 1090. The electronic system 1000 may communicate using Wimax (World Interoperability for Microwave Access) 1030, WLAN (Wireless LAN) 1100 and/or UWB (Ultra Wideband) 1110 etc.

Embodiments of the inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the embodiments of the inventive concept can be construed by programmers in the art to which this invention belongs.

As described above, according to at least one embodiment of the inventive concept, a deskew synchronous code allowing a deskew mode to be identified is inserted into a data synchronous period without changing an existing high-speed interface (e.g., MIPI) protocol, so that there is no individually added link circuit or discarded garbage data period.

In other words, according to at least one embodiment of the inventive concept, a protocol for deskewing a clock signal and data is added in a high-speed interface, thereby reducing skew between the clock signal and the data. Since the modification of the protocol does not require the addition or change of pins or channels in an existing high-speed interface system, the embodiments of the inventive concept are compatible with existing systems.

While the inventive concept has been particularly shown and described with reference to exemplary embodiments thereof, it will be understood by those of ordinary skill in the art that various changes in forms and details may be made therein without departing from the spirit and scope of the inventive concept.

What is claimed is:

1. A high-speed data transmitter comprising:
a transmitter configured to sequentially transmit a deskew synchronous code and test data, and configured to sequentially transmit a normal synchronous code and normal data,
wherein the deskew synchronous code has a different pattern than the normal synchronous code, and the normal synchronous code includes 8-bit serial data "00011101".

2. The high-speed data transmitter of claim 1, wherein the high-speed data transmitter is an application processor.

3. The high-speed data transmitter of claim 1, wherein the high-speed data transmitter is an image sensor.

4. The high-speed data transmitter of claim 3, wherein the test data includes 8-bit serial data "01010101".

5. The high-speed data transmitter of claim 3, wherein the deskew synchronous code includes 8-bit serial data "11111111".

6. The high-speed data transmitter of claim 5, wherein the transmitter is configured to transmit differential signals as the normal data.

7. The high-speed data transmitter of claim 5, wherein the transmitter further comprises:
a third transmission channel unit configured to transmit a third part of the deskew synchronous code and a third part of the test data through a third channel; and
a fourth transmission channel unit configured to transmit a fourth part of the deskew synchronous code and a fourth part of the test data through a fourth channel.

8. The high-speed data transmitter of claim 5, wherein the normal data is image data.

9. A high-speed data receiver comprising:
a receiver configured to sequentially receive a deskew synchronous code and test data, and configured to sequentially receive a normal synchronous code and normal data,
wherein the deskew synchronous code has a different pattern than the normal synchronous code, and the normal synchronous code includes 8-bit serial data "00011101".

10. The high-speed data receiver of claim 9, wherein the high-speed data receiver is an application processor.

11. The high-speed data receiver of claim 9, wherein the high-speed data receiver is a display serial interface device.

12. The high-speed data receiver of claim 11, wherein the test data includes 8-bit serial data "01010101".

13. The high-speed data receiver of claim 11, wherein the deskew synchronous code includes 8-bit serial data "11111111".

14. The high-speed data receiver of claim 13, wherein the receiver is configured to receive differential signals as the normal data.

15. The high-speed data receiver of claim 9, wherein the receiver is configured to initiate a deskew calibration operation upon detection of the deskew synchronous code.

16. The high-speed data receiver of claim 15, wherein the receiver is configured to perform the deskew calibration operation during at least one of a plurality of vertical blanking periods.

17. An application processor comprising:
a transmitter D-PHY module configured to transmit a first deskew synchronous code through a first channel and to transmit a first clock signal through a first clock channel; and
a receiver D-PHY module configured to receive a second deskew synchronous code through a second channel and to receive a second clock signal through a second clock channel,
wherein the first deskew synchronous code is a sequence of all 1s.

* * * * *